US 9,508,793 B2
(12) United States Patent
Wu et al.

(10) Patent No.: US 9,508,793 B2
(45) Date of Patent: Nov. 29, 2016

(54) SEMICONDUCTOR DEVICE AND METHOD OF OPERATING THE SAME AND STRUCTURE FOR SUPPRESSING CURRENT LEAKAGE

(71) Applicant: Episil Technologies Inc., Hsinchu (TW)

(72) Inventors: Hsiao-Chia Wu, Hsinchu (TW); Dun-Jen Teng, Hsinchu (TW); Chi-Jei Dai, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 0 days.

(21) Appl. No.: 14/583,196

(22) Filed: Dec. 26, 2014

(65) Prior Publication Data
US 2016/0118378 A1 Apr. 28, 2016

(30) Foreign Application Priority Data
Oct. 27, 2014 (TW) .............................. 103137000 A

(51) Int. Cl.
*H01L 29/00* (2006.01)
*H01L 29/06* (2006.01)
*H01L 29/861* (2006.01)
*H01L 29/40* (2006.01)

(52) U.S. Cl.
CPC ......... *H01L 29/0653* (2013.01); *H01L 29/402* (2013.01); *H01L 29/8611* (2013.01); *H01L 29/8613* (2013.01)

(58) Field of Classification Search
CPC ............. H01L 29/861; H01L 29/8611; H01L 29/8613

USPC .................................. 257/509, 510, 547, 551
See application file for complete search history.

(56) References Cited

U.S. PATENT DOCUMENTS

| | | | |
|---|---|---|---|
| 7,812,393 B2 | 10/2010 | Williams et al. | |
| 2013/0015523 A1 | 1/2013 | You | |
| 2013/0313651 A1* | 11/2013 | Cheng ................. | H01L 27/0629 257/369 |

FOREIGN PATENT DOCUMENTS

| | | |
|---|---|---|
| JP | 2001217420 | 8/2001 |
| TW | 335513 | 7/1998 |
| TW | 200428774 | 12/2004 |
| TW | 200805623 | 1/2008 |
| TW | 201104831 | 2/2011 |
| TW | 201230344 | 7/2012 |
| TW | I419333 | 12/2013 |

OTHER PUBLICATIONS

"Office Action of Taiwan Counterpart Application", issued on Apr. 11, 2016, p. 1-p. 5.

* cited by examiner

*Primary Examiner* — Matthew E Warren
(74) *Attorney, Agent, or Firm* — Jianq Chyun IP Office

(57) ABSTRACT

A structure for suppressing current leakage and a semiconductor device including the same are provided. The structure for suppressing current leakage includes a substrate of a first conductivity type, a well region of the first conductivity type, an isolation structure and a PN junction diode. The well region is disposed in the substrate. The isolation structure is disposed on the well region. The PN junction diode is disposed on the isolation structure and configured to suppress current leakage of the semiconductor device.

20 Claims, 2 Drawing Sheets

SEMICONDUCTOR DEVICE AND METHOD OF OPERATING THE SAME AND STRUCTURE FOR SUPPRESSING CURRENT LEAKAGE

CROSS REFERENCE TO RELATED APPLICATION

This application claims the priority benefit of Taiwan application serial no. 103137000, filed on Oct. 27, 2014. The entirety of the above-mentioned patent application is hereby incorporated by reference herein and made a part of specification.

BACKGROUND OF THE INVENTION

1. Field of the Invention

The invention relates to a semiconductor device, and particularly relates to a structure for suppressing current leakage and a semiconductor device including the structure for suppressing current leakage.

2. Description of Related Art

Recently, as people are gaining the awareness of environmental protection, high voltage power integrated circuits featuring low power consumption and high power conversion efficiency are drawing more and more attention. Generally speaking, the high voltage power integrated circuits are mainly used in power switch devices and applied in the fields of switching mode power supply (SMPS), luminaire, motor control, or plasma display driver, etc.

In the high voltage power integrated circuits, high voltage semiconductor devices and low voltage logic control circuits are integrated in a single chip. The high voltage power integrated circuits accordingly have several advantages, such as high reliability, high stability, low power consumption, small size, and low cost, etc. While the high voltage semiconductor devices are capable of taking a high voltage at hundreds of volts, they are controlled by the low voltage logic control circuits operated at tens of volts or lower. To make the low voltage control circuits suitable for the high voltage semiconductor devices, level shifters are commonly used to shift a low voltage signal to a higher voltage level. Isolation between adjacent transistors in the level shifters has been an issue that researchers in relevant industries are working on. Thus, a structure capable of effectively suppressing current leakage is required to improve the isolation between the adjacent transistors.

SUMMARY OF THE INVENTION

The invention provides a structure for suppressing current leakage and a semiconductor device including the structure, in which an isolation structure and a PN junction diode are sequentially disposed on a substrate and a well region of the same conductivity type. In this way, the current leakage of the semiconductor device can be improved.

The invention provides a semiconductor device, which includes a substrate of a first conductivity type, a first well region of the first conductivity type, a first metal oxide semiconductor device, a second metal oxide semiconductor device, an isolation structure, and a PN junction diode. The substrate includes a first area, a second area, and a third area. The second area is located between the first area and the third area. The first well region is located in the substrate in the second area. The first metal oxide semiconductor device is located in the first area. The second metal oxide semiconductor device is located in the third area. The isolation structure is located on the first well region. The PN junction diode is located on the isolation structure.

According to an embodiment of the invention, the PN junction diode has a first part, a second part, and a third part. The third part is located between the first part and the second part. The third part is of a second conductivity type, and the first part and the second part are of opposite conductivity types.

According to an embodiment of the invention, in the PN junction diode, a doping concentration of the third part is lower than a doping concentration of the first part or the second part.

According to an embodiment of the invention, the first metal oxide semiconductor device includes a second well region of the second conductivity type and a first doped region of the second conductivity type. The second well region is located in the substrate in the first area. The first doped region is located in the second well region. In addition, the first doped region is electrically connected to the first part of the PN junction diode.

According to an embodiment of the invention, the second metal oxide semiconductor device includes a third well region of the second conductivity type and a second doped region of the second conductivity type. The third well region is located in the substrate in the third area. The second doped region is located in the third well region. In addition, the second doped region is electrically connected to the second part of the PN junction diode.

According to an embodiment of the invention, each of the first metal oxide semiconductor device and the second metal oxide semiconductor device includes a lateral diffused metal oxide semiconductor device or a junction field effect transistor.

According to an embodiment of the invention, the PN junction diode is a polysilicon diode.

According to an embodiment of the invention, the material of the isolation structure includes silicon oxide.

According to an embodiment of the invention, the isolation structure includes a field oxide structure or a shallow trench isolation structure.

According to an embodiment of the invention, the first area is a high voltage area and the third area is a low voltage area, or the first area is a low voltage area and the third area is a high voltage area.

The invention provides a method of operating the said semiconductor device. The operating method includes applying a first voltage to the first doped region, and applying a second voltage to the second doped region, wherein the first voltage is higher than the second voltage.

According to an embodiment of the invention, wherein the first voltage is lower than or equal to about 50V.

According to an embodiment of the invention, the first voltage and the second voltage differ in a range of about 5V to 20V.

The invention provides a structure for suppressing current leakage, which includes a substrate of a first conductivity type, a well region of the first conductivity type, an isolation structure, and a PN junction diode. The well region is located in the substrate. The isolation structure is located on the well region. The PN junction diode is located on the isolation structure.

According to an embodiment of the invention, the PN junction diode has a first part, a second part, and a third part. The third part is located between the first part and the second part. The third part is of a second conductivity type, and the first part and the second part are of opposite conductivity types.

According to an embodiment of the invention, in the PN junction diode, a doping concentration of the third part is lower than a doping concentration of the first part or the second part.

According to an embodiment of the invention, the first part of the PN junction diode is electrically connected to a first metal oxide semiconductor device, and the second part of the PN junction diode is electrically connected to a second metal oxide semiconductor device.

According to an embodiment of the invention, the PN junction diode is a polysilicon diode.

According to an embodiment of the invention, the material of the isolation structure includes silicon oxide.

According to an embodiment of the invention, the isolation structure includes a field oxide structure or a shallow trench isolation structure.

Based on the above, in the semiconductor device of the invention, since the isolation structure and the PN junction diode are sequentially disposed on the substrate and the well region of the same conductivity type, the reduced surface field (RESURF) effect can be achieved, and the concentration of a P-well region can be modulated by using the reduced surface field. In this way, the structure of the invention not only effectively increases a breakdown voltage, but also suppresses the current leakage of the semiconductor device.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
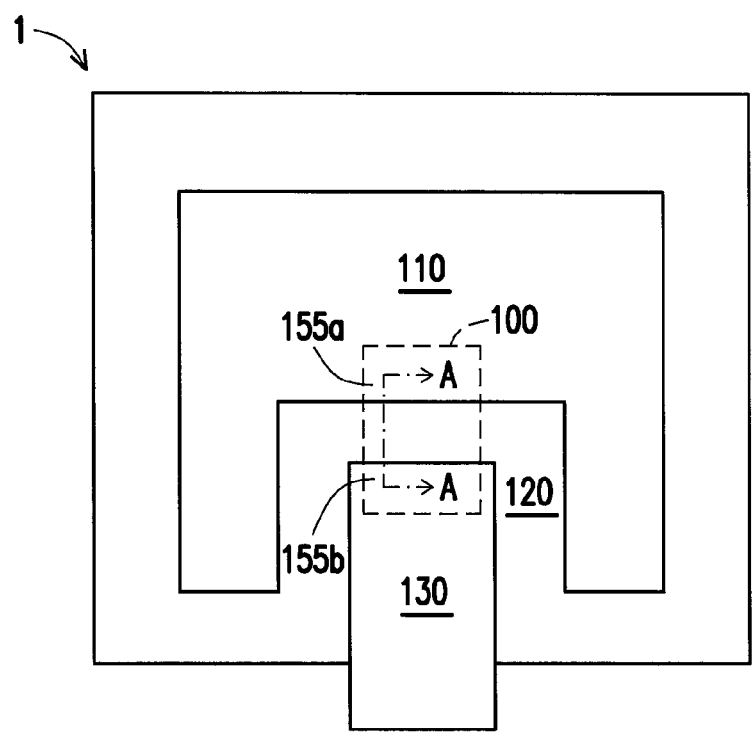
FIG. 1 is a schematic top view illustrating a semiconductor device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In the following embodiments, when a first conductivity type is N-type, a second conductivity type is P-type, and when the first conductivity type is P-type, the second conductivity type is N-type. The following embodiment is described by taking P-type as the first conductivity type and N-type as the second conductivity type. However, the invention is not limited thereto. The P-type dopant includes boron, and the N-type dopant includes phosphorous or arsenic.

FIG. 1 is a schematic top view illustrating a semiconductor device according to an embodiment of the invention.

A semiconductor device 1 of the invention has a first area 110, a second area 120, and a third area 130. The first area 110 has a recess region. A part of the third area 130 is located in the recess region. However, the invention is not limited thereto. In other embodiments, the entire third area 130 may be disposed in the recess region. The second area 120 is located around the first area 110, and between the first area 110 and the third area 130. The first area 110, the second area 120, and the third area 130 are arranged in a sequence, viewing along the A-A line and in a direction extending outwardly from the center of the semiconductor device 1.

In this embodiment, the first area 110 may be an active area, such as a high voltage device area, for example. The third area 130 may be another active area, such as a logic circuit area, a peripheral circuit area, or a low voltage device area, for example. The second area 120 may be a diffusion region or a drift region, for example. However, the invention is not limited thereto. In another embodiment, the semiconductor device 1 of the invention may further include an isolation region (not shown) around the second area 120. In other words, the isolation region may be located between the second area 120 and the third area 130. The isolation region may have an isolation structure constituted by a localized oxidation isolation (LOCOS) structure, a shallow trench isolation (STI) structure, a well region, or a combination thereof.

It is noted that the semiconductor device 1 of the invention includes a level shifter 100 for controlling signal conversion between the first area 110 and the third area 130. The level shifter 100 is disposed between the first area 110 and the third area 130. In an embodiment, as shown in FIG. 1, the level shifter 100 is disposed across the first area 110, the second area 120, and the third area 130, and is electrically connected to the first area 110 and the third area 130.

Figure 2:
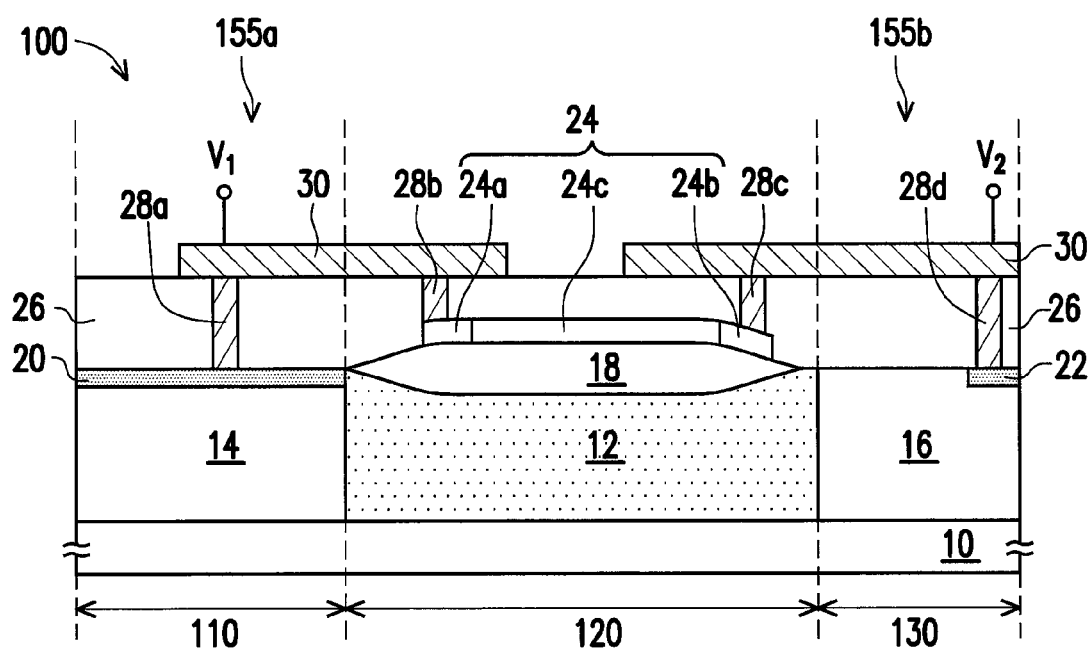
FIG. 2 is a schematic cross-sectional view taken along the A-A line of FIG. 1.

FIG. 2 is a schematic cross-sectional view taken along the A-A line of FIG. 1.

Referring to FIG. 1 and FIG. 2, the level shifter 100 of the invention includes a substrate 10 of the first conductivity type, a first well region 12 of the first conductivity type, a first metal oxide semiconductor device 155a, a second metal oxide semiconductor device 155b, an isolation structure 18, and a PN junction diode 24.

The substrate 10 of the level shifter 100 includes the first area 110, the second area 120, and the third area 130, and the second area 120 is located between the first area 110 and the third area 130. In this embodiment, the first area 110 may be a high voltage area, and the third area 130 may be a low voltage area. The first area 110 and the third area 130 may be regarded as active areas, whereas the second area 120 may be regarded as a drift region or a current suppressing region. However, the invention is not limited thereto. In another embodiment, the first area 110 may be a low voltage area, and the third area 130 may be a high voltage area. The conventional level shifter is commonly found to have current leakage in a low voltage operation. However, in the level shifter 100 of the invention, since the isolation structure 18 and the PN junction diode 24 are sequentially disposed on the substrate 10 and the first well region 12 of the same conductivity type, the current leakage can be improved. In an embodiment, the low voltage can be lower than or equal to about 50V, for example.

The substrate 10 may be a P-type semiconductor substrate, such as a P-type silicon-containing epitaxial layer, for example. The first metal oxide semiconductor device 155a is located in the first area 110. The second metal oxide semiconductor device 155b is located in the third area 130.

The first well region 12 is a P-type high voltage well region and is located in the substrate 10 in the second area 120. In an embodiment, the dopant implanted in the first well region 12 includes boron, and the doping concentration may be in a range of about $1\times10^{14}/\text{cm}^3$ to $1\times10^{15}/\text{cm}^3$.

The isolation structure 18 is located on the first well region 12. The material of the isolation structure 18 includes silicon oxide. The isolation structure 18 is a field oxide (FOX) structure or a shallow trench isolation (STI) structure, for example.

It is noted that the PN junction diode 24 in the level shifter 100 of the invention is not only capable of achieving the RESURF effect, but also capable of modulating the concentration of the first well region 12 (e.g. a P-type high voltage well region) and reducing the current leakage of the semiconductor device 1 by reducing the surface field. The PN junction diode 24 is located on the isolation structure 18. In an embodiment, the PN junction diode 24 may be a polysilicon diode. In addition, the PN junction diode 24 may have a first part 24a, a second part 24b, and a third part 24c. The third part 24c is located between the first part 24a and the second part 24b. In an embodiment, the third part 24c of the PN junction diode 24 is of a second conductivity type, and the first part 24a and the second part 24b are of opposite conductivity types. More specifically, a central part (i.e. the third part 24c) of the PN junction diode 24 has an N-type dopant, a first edge part (i.e. the first part 24a) has an N-type dopant, and a second edge part (i.e. the second part 24b) has a P-type dopant.

Moreover, the central part (i.e. the third part 24c) of the PN junction diode 24 has a doping concentration lower than that of the edge regions (i.e. the first part 24a or the second part 24b). In an embodiment, the dopant implanted in the second part 24b of the PN junction diode 24 includes boron, and the doping concentration may be in a range of about $1\times10^{18}/\text{cm}^3$ to $1\times10^{20}/\text{cm}^3$. The dopant implanted in the first part 24a of the PN junction diode 24 includes phosphorous or arsenic, and the doping concentration may be in a range of about $1\times10^{18}/\text{cm}^3$ to $1\times10^{20}/\text{cm}^3$. The dopant implanted in the third part 24c of the PN junction diode 24 includes phosphorous or arsenic, and the doping concentration may be in a range of about $1\times10^{14}/\text{cm}^3$ to $1\times10^{15}/\text{cm}^3$.

In this embodiment, the material of the PN junction diode 24 is polysilicon, for example. However, the invention is not limited thereto. In another embodiment, the PN junction diode 24 may be a silicon diode, a germanium diode, a silicon carbide diode or a gallium nitride diode.

The first metal oxide semiconductor device 155a is a lateral diffused metal oxide semiconductor (LDMOS) device or a junction field effect transistor (JFET), for example, and is located in the first area 110. The first metal oxide semiconductor device 155a includes a second well region 14 of the second conductivity type and a first doped region 20 of the second conductivity type. The second well region 14 is located in the substrate 10 in the first area 110, and the first doped region 20 is located in the second well region 14. Similarly, the second metal oxide semiconductor device 155b may be a LDMOS device or a JFET, and is located in the third area 130. The second metal oxide semiconductor device 155b includes a third well region 16 of the second conductivity type and a second doped region 22 of the second conductivity type. The third well region 16 is located in the substrate 10 in the third area 130, and the second doped region 22 is located in the third well region 16. In an embodiment, the first and second metal oxide semiconductor devices 155a and 155b have the same structure and are disposed asymmetrically with respect to the second area 120, as shown in FIG. 2. However, the invention is not limited thereto. In other words, the first and second metal oxide semiconductor devices 155a and 155b may have the same or different structures, and may be disposed symmetrically or asymmetrically with respect to the second area 120.

The second well region 14 and the third well region 16 are N-type well regions, for example, and are respectively located at two sides of the first well region 12 and adjacent to the first well region 12. In this embodiment, the first well region 12 contacts the second well region 14 and the third well region 16. However, the invention is not limited thereto. In another embodiment (not shown), the first well region 12 may be separated from the second well region 14 and the third well region 16. In an embodiment, the dopant implanted into the second well region 14 and the third well region 16 includes phosphorous or arsenic, the doping concentration of the second well region 14 may be in a range of about $1\times10^{15}/\text{cm}^3$ to $1\times10^{16}/\text{cm}^3$, and the doping concentration of the third well region 16 may be in a range of about $1\times10^{15}/\text{cm}^3$ to $1\times10^{16}/\text{cm}^3$. The first doped region 20 may be an N-type heavily doped region, located in the second well region 14, and electrically connected to the first part 24a (e.g. an N-type heavily doped region) of the PN junction diode 24. The second doped region 22 may be an N-type heavily doped region, located in the third well region 16, and electrically connected to the second part 24b (e.g. a P-type heavily doped region) of the PN junction diode 24. In an embodiment, the dopant implanted in the first doped region 20 and the second doped region 22 includes phosphorous or arsenic, the doping concentration of the first doped region 20 may be in a range of about $1\times10^{18}/\text{cm}^3$ to $1\times10^{20}/\text{cm}^3$, and the doping concentration of the second doped region 22 may be in a rage of about $1\times10^{18}/\text{cm}^3$ to $1\times10^{20}/\text{cm}^3$. In this embodiment, the first doped region 20 and the second doped region 22 are of the second conductivity type. However, the invention is not limited thereto. In other embodiments, the first doped region 20 and the second doped region 22 may be of different conductivity types.

The level shifter 100 of the invention may further include a dielectric layer 26, contacts 28a to 28d, and a conductive layer 30, as shown in FIG. 2. The dielectric layer 26 is disposed on the substrate 10, and the material thereof includes silicon oxide, silicon nitride, or silicon oxynitride. The conductive layer 30 is disposed on the dielectric layer 26, and the material thereof includes metal, such as aluminum, copper, or an alloy thereof. The contacts 28a to 28d penetrate through the dielectric layer 26, and the material thereof includes tungsten, titanium, tantalum, aluminum, copper, or an alloy thereof.

Figure 4:
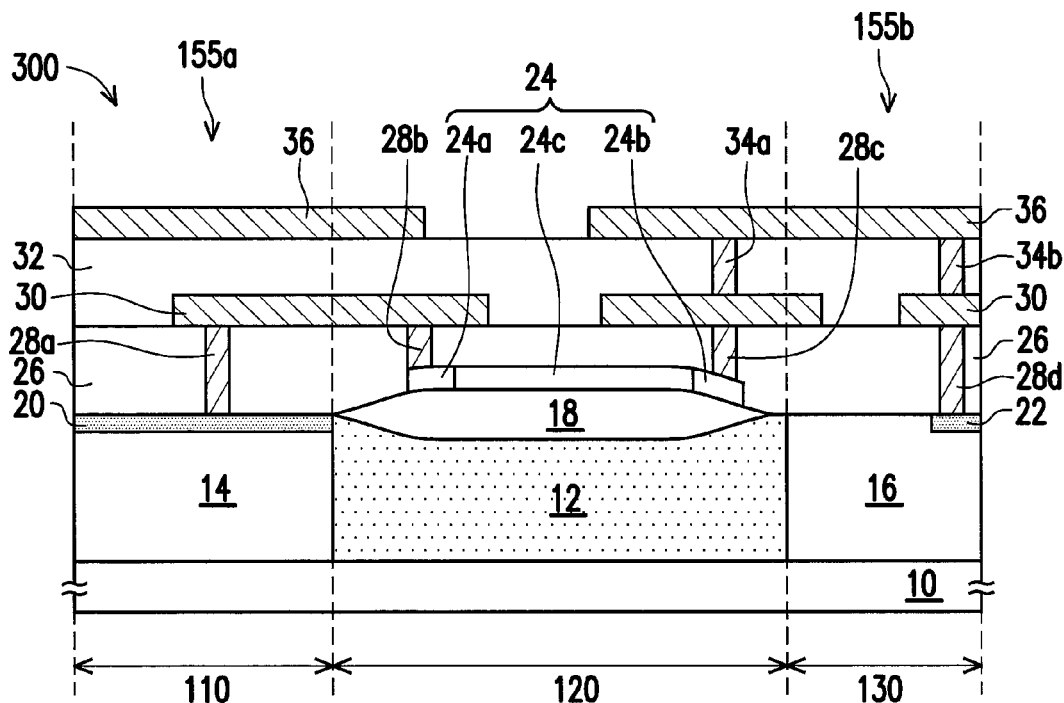
FIG. 4 is a schematic cross-sectional view illustrating a semiconductor device according to yet another embodiment of the invention.

In addition, a level shifter 200 of the invention may further include a dielectric layer 32, vias 34a to 34b and a conductive layer 36, as shown in FIG. 4. The dielectric layer 32 is disposed on the conductive layer 30, and the material thereof includes silicon oxide, silicon nitride, or silicon oxynitride. The conductive layer 36 is disposed on the dielectric layer 32, and the material thereof includes metal, such as aluminum, copper, or an alloy thereof. The vias 34a to 34b penetrate through the dielectric layer 32, and the material thereof includes tungsten, titanium, tantalum, aluminum, copper, or an alloy thereof.

It is noted that the first part 24a of the PN junction diode 24 is electrically connected to the first doped region 20, and the second part 24b of the PN junction diode 24 is electrically connected to the second doped region 22. The first doped region 20 is at a high voltage level, and the second doped region 22 is at a low voltage level. In an embodiment, a difference in voltage level between the first doped region 20 and the second doped region 22 is in a range of about 5V to 20V. An operating method of the invention will be separately described in the following.

More specifically, in an embodiment, the first part 24a of the PN junction diode 24 can be electrically connected to the first doped region 20 through the vias 28a and 28b and the conductive layer 30, and the second part 24b of the PN junction diode 24 can be electrically connected to the second doped region 22 through the vias 28c and 28d and the conductive layer 30, as shown in FIG. 2.

Figure 3:
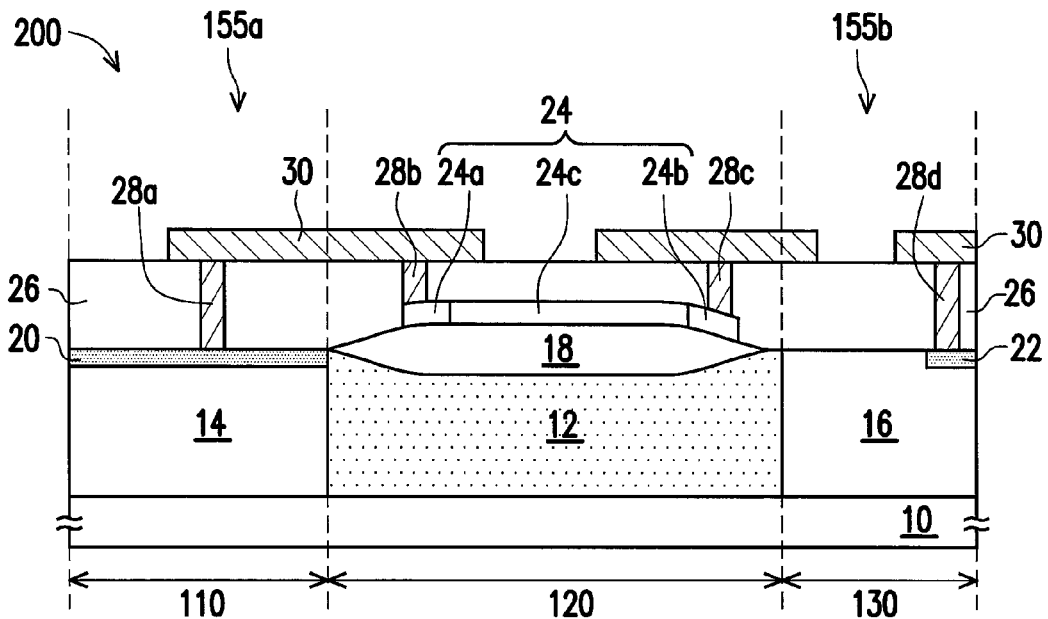
FIG. 3 is a schematic cross-sectional view illustrating a semiconductor device according to another embodiment of the invention.

In another embodiment, the first part 24a of the PN junction diode 24 can be electrically connected to the first doped region 20 through the vias 28a and 28b and the conductive layer 30, and the second part 24b of the PN junction diode 24 can be electrically connected to the second doped region 22 through the vias 28c and 28d and the conductive layer 30, as shown in FIG. 3. In FIG. 3, since the second part 24b of the PN junction diode 24 and the second doped region 22 are electrically connected to each other through a plane routing, so this is not shown in this cross section.

In yet another embodiment, the first part 24a of the PN junction diode 24 can be electrically connected to the first doped region 20 through the vias 28a and 28b and the conductive layer 30, and the second part 24b can be electrically connected to the second doped region 22 through the contacts 28c and 28d, the conductive layer 30, the vias 34a and 34b, and the conductive layer 36, as shown in FIG. 4.

The invention also provides a method of operating the semiconductor device. Referring to FIG. 2, a first voltage $V_1$ may be applied to the first doped region 20 of the first metal oxide semiconductor device 155a and a second voltage $V_2$ may be applied to the second doped region 22 to the metal oxide second semiconductor device 155b. In an embodiment, the first voltage $V_1$ is higher than the second voltage $V_2$, and the first voltage $V_1$ is lower than or equal to about 50V. In this embodiment, the PN junction diode 24 is disposed on the isolation structure 18. In such disposition, the PN junction diode 24 can be fully depleted before the breakdown voltage is reached. The concentration of the P-type high voltage well region (i.e. the first well region 12) can be increased due to the space charge effect of the PN junction diode 24, thereby achieving the characteristics of high breakdown voltage. On the other hand, since the concentration of the P-type high voltage well region (i.e. the first well region 12) is increased, in a low voltage (e.g. about 50V or less) operation, the current leakage of the entire semiconductor device 1 is improved.

In addition, the invention further provides a structure for suppressing current leakage. The structure is located in the second area 120 of the substrate 10, as shown in FIG. 2. Specifically, the structure for suppressing current leakage includes the substrate 10 of the first conductivity type, the first well region 12 of the first conductivity type, the isolation structure 18, and the PN junction diode 24. The first well region 12 is located in the substrate 10. The isolation structure 18 is located on the first well region 12. The PN junction diode 24 is located on the isolation structure 18. In addition, the first part 24a of the PN junction diode 24 is electrically connected to the first doped region 20 of the first metal oxide semiconductor device 155a, and the second part 24b of the PN junction diode 24 is electrically connected to the second doped region 22 of the second metal oxide semiconductor device 155b.

In view of the foregoing, in the semiconductor device of the invention, a level shifter is configured to control signal conversion between the high voltage area and the low voltage area. The level shifter has the structure for suppressing current leakage, in which a P-type well region, an isolation structure, and a PN junction diode are sequentially disposed on a P-type substrate. Such device achieves the RESURF effect and effectively increases the breakdown voltage. Besides, since the concentration of the P-type high voltage well region (i.e. the first well region 12) is increased, under the low voltage (e.g. about 50V or less) operation, the current leakage of the entire semiconductor device is improved. Accordingly, the reliability and stability of the semiconductor device of the invention are improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate of a first conductivity type, comprising a first area, a second area, and a third area, wherein the second area is located between the first area and the third area;
   a first well region of the first conductivity type, located in the substrate in the second area;
   a first metal oxide semiconductor device, located in the first area;
   a second metal oxide semiconductor device, located in the third area;
   an isolation structure, located on the first well region; and
   a PN junction diode, located on a top surface of the isolation structure.

2. The semiconductor device as claimed in claim 1, wherein the PN junction diode has a first part, a second part, and a third part, the third part is located between the first part and the second part, the third part is of a second conductivity type, and the first part and the second part are of opposite conductivity types.

3. The semiconductor device as claimed in claim 2, wherein in the PN junction diode, a doping concentration of the third part is lower than a doping concentration of the first part or the second part.

4. The semiconductor device as claimed in claim 2, wherein the first metal oxide semiconductor device comprises:
   a second well region of the second conductivity type, located in the substrate in the first area; and
   a first doped region of the second conductivity type, located in the second well region, wherein the first doped region is electrically connected to the first part of the PN junction diode.

5. The semiconductor device as claimed in claim 4, wherein the second metal oxide semiconductor device comprises:
   a third well region of the second conductivity type, located in the substrate in the third area; and
   a second doped region of the second conductivity type, located in the third well region, wherein the second doped region is electrically connected to the second part of the PN junction diode.

6. The semiconductor device as claimed in claim 1, wherein each of the first metal oxide semiconductor device and the second metal oxide semiconductor device comprises a lateral diffused metal oxide semiconductor device or a junction field effect transistor.

7. The semiconductor device as claimed in claim 1, wherein the PN junction diode is a polysilicon diode.

8. The semiconductor device as claimed in claim 1, wherein a material of the isolation structure comprises silicon oxide.

9. The semiconductor device as claimed in claim 1, wherein the isolation structure comprises a field oxide structure or a shallow trench isolation structure.

10. The semiconductor device as claimed in claim 1, wherein the first area is a high voltage area and the third area is a low voltage area, or the first area is a low voltage area and the third area is a high voltage area.

11. A method of operating the semiconductor device as claimed in claim 5, comprising:
applying a first voltage to the first doped region; and
applying a second voltage to the second doped region, wherein the first voltage is higher than the second voltage.

12. The method as claimed in claim 11, wherein the first voltage is lower than or equal to 50V.

13. The method as claimed in claim 11, wherein the first voltage and the second voltage differ in a range of 5V to 20V.

14. A structure for suppressing current leakage, comprising:
a substrate of a first conductive type;
a well region of the first conductivity type, located in the substrate;
an isolation structure, located on the well region; and
a PN junction diode, located on a top surface of the isolation structure.

15. The structure for suppressing current leakage as claimed in claim 14, wherein the PN junction diode has a first part, a second part, and a third part, the third part is located between the first part and the second part, the third part is of a second conductivity type, and the first part and the second part are of opposite conductivity types.

16. The structure for suppressing current leakage as claimed in claim 15, wherein in the PN junction diode, a doping concentration of the third part is lower than a doping concentration of the first part or the second part.

17. The structure for suppressing current leakage as claimed in claim 15, wherein the first part of the PN junction diode is electrically connected to a first metal oxide semiconductor device, and the second part of the PN junction diode is electrically connected to a second metal oxide semiconductor device.

18. The structure for suppressing current leakage as claimed in claim 14, wherein the PN junction diode is a polysilicon diode.

19. The structure for suppressing current leakage as claimed in claim 14, wherein a material of the isolation structure comprises silicon oxide.

20. The structure for suppressing current leakage as claimed in claim 14, wherein the isolation structure comprises a field oxide structure or a shallow trench isolation structure.

* * * * *